(12) United States Patent
Tanaka et al.

(10) Patent No.: US 10,972,051 B2
(45) Date of Patent: Apr. 6, 2021

(54) POWER AMPLIFIER CIRCUIT

(71) Applicant: Murata Manufacturing Co., Ltd., Kyoto (JP)

(72) Inventors: Satoshi Tanaka, Kyoto (JP); Satoshi Arayashiki, Kyoto (JP); Kazuo Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 58 days.

(21) Appl. No.: 16/538,932

(22) Filed: Aug. 13, 2019

(65) Prior Publication Data
US 2020/0083845 A1 Mar. 12, 2020

(30) Foreign Application Priority Data
Sep. 12, 2018 (JP) .............................. JP2018-170848

(51) Int. Cl.
*H03F 1/02* (2006.01)
*H03F 3/21* (2006.01)

(52) U.S. Cl.
CPC .............. *H03F 1/0205* (2013.01); *H03F 3/21* (2013.01); *H03F 2200/387* (2013.01); *H03F 2200/451* (2013.01)

(58) Field of Classification Search
CPC ..................................................... H03F 1/0205
USPC ......................................................... 330/296
See application file for complete search history.

(56) References Cited

U.S. PATENT DOCUMENTS

| 9,641,135 | B2* | 5/2017 | Arcidiacono | ............. H03F 1/32 |
|---|---|---|---|---|
| 2002/0012404 | A1* | 1/2002 | Ahn | ....................... H03F 1/3241 |
| | | | | 375/297 |
| 2003/0214356 | A1* | 11/2003 | Cowley | ............... H03F 3/45089 |
| | | | | 330/254 |
| 2013/0114665 | A1* | 5/2013 | Aziz | ....................... H03F 3/211 |
| | | | | 375/233 |
| 2013/0314143 | A1* | 11/2013 | Ahmed | ................... H03F 3/211 |
| | | | | 327/360 |
| 2016/0269008 | A1* | 9/2016 | Facchini | ................. H03F 3/601 |
| 2016/0329869 | A1* | 11/2016 | Tanaka | ...................... H03F 1/34 |

OTHER PUBLICATIONS

Satoshi Tanaka, "Progress of the Linear RF Power Amplifier for Mobile Phones", IEICE Trans. Fundamentals, vol. E101-A, No. 2, Feb. 2018, pp. 385-395.

* cited by examiner

*Primary Examiner* — Patricia T Nguyen
(74) *Attorney, Agent, or Firm* — Pearne & Gordon LLP (57) ABSTRACT

A power amplifier circuit includes a first amplifier that amplifies an input signal and outputs an output signal; a second amplifier that, in accordance with a control signal, amplifies a signal corresponding to the input signal, generates a signal having an opposite phase to that of the output signal, and adds the signal to the output signal; and a control circuit that supplies the control signal to the second amplifier. The control circuit outputs the control signal so that during operation of the power amplifier circuit in a first power mode, a gain of the second amplifier is not less than zero and less than a predetermined level and during operation in a second power mode lower than the first power mode in output power level, a gain of the second amplifier is not less than the predetermined level and less than a gain of the first amplifier.

14 Claims, 10 Drawing Sheets

POWER AMPLIFIER CIRCUIT

This application claims priority from Japanese Patent Application No. 2018-170848 filed on Sep. 12, 2018. The content of this application is incorporated herein by reference in its entirety.

BACKGROUND

The present disclosure relates to a power amplifier circuit. In mobile communication devices, such as cellular phones, a power amplifier circuit that amplifies power of a transmission signal is mounted. A desired power level of a transmission signal differs according to a distance between a mobile communication device and a base station, or a radio wave propagation environment. Hence, it is desirable that, in the power amplifier circuit, power can be amplified in a wide range. For example, Satoshi Tanaka, "Progress of the linear RF power amplifier for mobile phones", IEICE Trans. Fundamentals, vol. E101-A, No. 2, pp. 385-395, 2018 discloses a power amplifier circuit that includes a path configured to output relatively high power and a path configured to output relatively low power, and that performs, in accordance with a necessary power level, switching to a path to be used.

However, in the power amplifier circuit disclosed in Satoshi Tanaka, "Progress of the linear RF power amplifier for mobile phones", IEICE Trans. Fundamentals, vol. E101-A, No. 2, pp. 385-395, 2018, a switch for switching between the paths is necessary. When this switch is inserted into a path, power consumption at a time when maximum power is output in particular may increase. On the other hand, if amplification to a necessary power level is to be performed by adjusting the gain of a single amplifier without necessarily using such a switch, it is difficult to provide a wide range.

BRIEF SUMMARY

The present disclosure has been made in view of such circumstances and aims to provide a power amplifier circuit that can amplify a signal in a wide range while inhibiting an increase in power consumption.

A power amplifier circuit according to one aspect of the present disclosure includes a first amplifier configured to amplify an input signal and output an output signal; a second amplifier configured to, in accordance with a control signal, amplify a signal corresponding to the input signal, generate a signal having an opposite phase to a phase of the output signal, and add the signal to the output signal; and a control circuit configured to supply the control signal to the second amplifier. The control circuit outputs the control signal so that, when the power amplifier circuit operates in a first power mode, a gain of the second amplifier is greater than or equal to zero and less than a predetermined level and so that, when the power amplifier circuit operates in a second power mode lower than the first power mode in output power level, a gain of the second amplifier is greater than or equal to the predetermined level and less than a gain of the first amplifier.

The present disclosure can provide the power amplifier circuit that can amplify a signal in a wide range while inhibiting an increase in power consumption.

Other features, elements, characteristics and advantages of the present disclosure will become more apparent from the following detailed description of preferred embodiments of the present disclosure with reference to the attached drawings.

DETAILED DESCRIPTION

Embodiments of the present disclosure will be described in detail below with reference to the drawings. The same elements are denoted by the same reference numerals, and a repeated description thereof is omitted.

Figure 1:
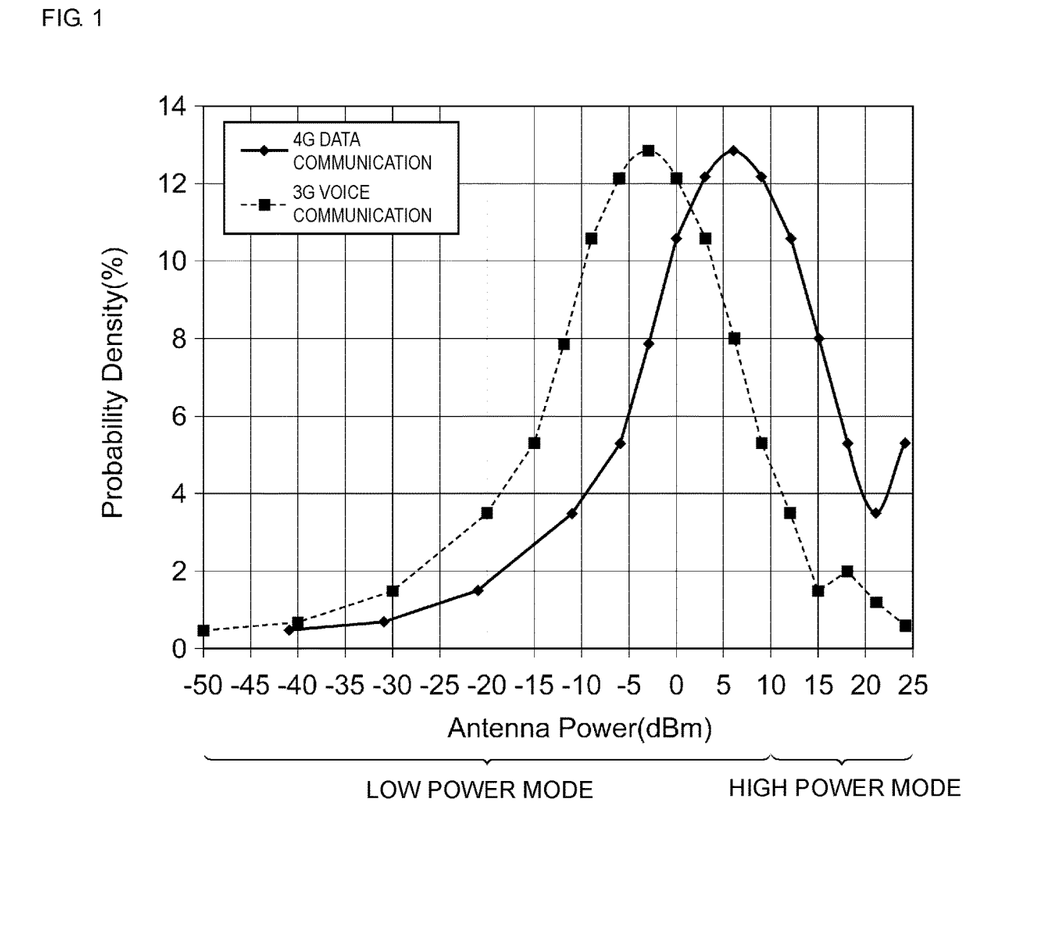
FIG. 1 illustrates a relationship between output power and probability density of a transmission signal at an antenna end of a cellular phone.

First, a power level of a transmission signal necessary for a cellular phone will be described with reference to FIGS. 1, 2A, and 2B. FIG. 1 illustrates a relationship between output power and probability density of a transmission signal at an antenna end of the cellular phone. Specifically, a graph illustrated in FIG. 1 represents probability densities of output powers of respective transmission signals at the antenna end in the case (solid line) where data communication is performed in a communication standard of the fourth generation mobile communication system (4G) and in the case (dashed line) where voice communication is performed in a communication standard of the third generation mobile communication system (3G). In FIG. 1, the horizontal axis represents output power (dBm), and the vertical axis represents probability density (%).

As illustrated in FIG. 1, the output power in 3G has a width of from about −50 dBm to about 25 dBm, and the output power in 4G has a width of from about −40 dBm to about 25 dBm. Thus, in a transmission module that generates a transmission signal, the transmission signal has to be amplified to various levels in accordance with necessary power levels. Furthermore, assuming that a region in which the output power is greater than or equal to about 10 dBm is called a high power mode and a region in which the output power is less than about 10 dBm is called a low power mode, it is seen that, both in data communication and in voice communication, an output power level at a highest probability density is included in the low power mode region. Hence, it can be said that amplification characteristics not only in the high power mode but also in the low power mode are important.

Figure 2A:
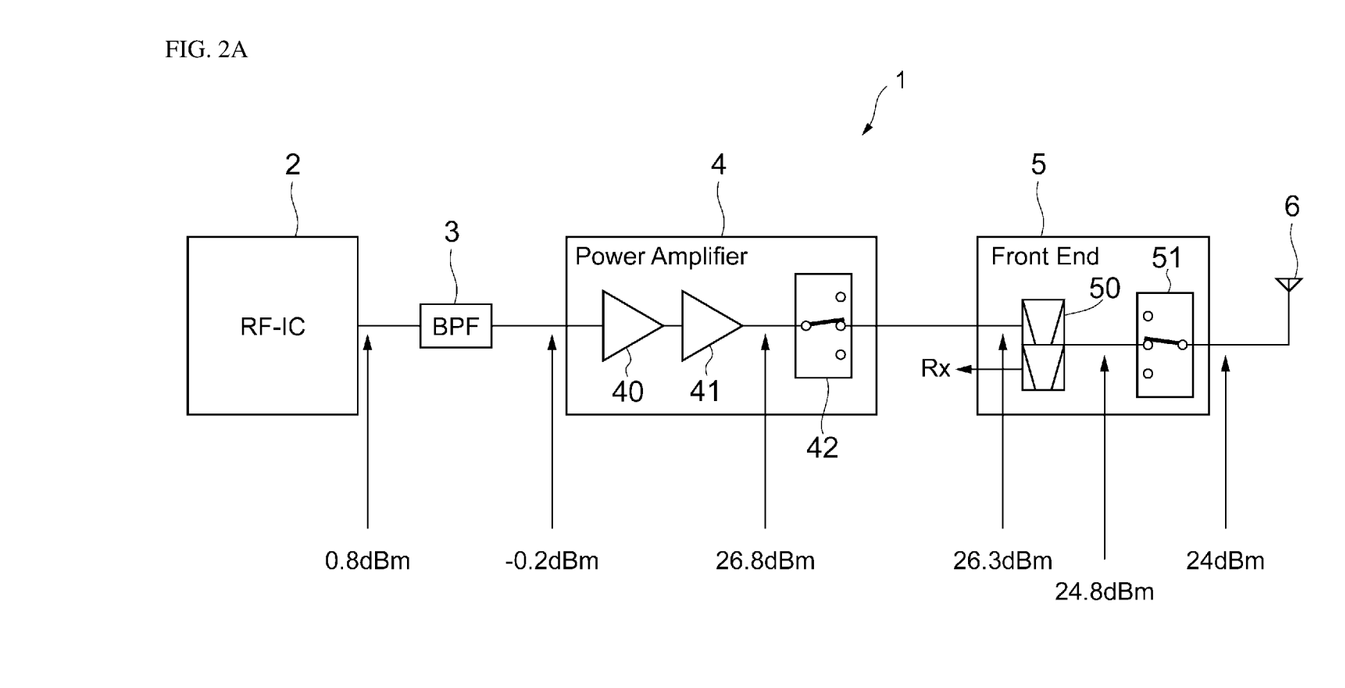
FIG. 2A illustrates, in the case where a power level of a transmission signal is caused to be a maximum, an example of a power of the transmission signal at each terminal of a transmission module.

FIG. 2A illustrates, in the case where a power level of a transmission signal is caused to be a maximum, an example of a power of the transmission signal at each terminal of a transmission module. A transmission module 1 is installed in a mobile communication device, such as a cellular phone, and is a circuit that generates and amplifies a transmission signal. The transmission module 1 includes, for example, a radio frequency (RF)—integrated circuit (IC) 2, a band pass filter circuit 3, a power amplifier module 4, a front-end circuit 5, and an antenna 6.

The RF-IC 2 is an IC chip including a baseband circuit (not illustrated) that generates a modulated signal from an input signal of, for example, voice or data on the basis of a certain modulation system, and an RF circuit (not illustrated) that generates a transmission signal from the modulated signal. Incidentally, examples of a modulated signal include an IQ signal in which the amplitude and the phase are represented in an IQ plane. Furthermore, examples of a transmission signal include radio frequency (RF) signals ranging from about several to several tens of GHz.

The transmission signal output from the RF-IC 2 is supplied to the power amplifier module 4 through the band pass filter circuit 3. The band pass filter circuit 3 is provided between the RF-IC 2 and the power amplifier module 4 to attenuate, if a frequency in a transmission frequency band is close to a frequency in a reception frequency band, noise in the reception frequency band output from the RF-IC 2.

The power amplifier module 4 includes amplifiers 40 and 41 and amplifies power of the transmission signal in two stages. The transmission signal whose power has been amplified is supplied to the front-end circuit 5 through a switch 42. The front-end circuit 5 includes a duplexer 50 that separates a transmission signal and a reception signal, and an antenna switch 51. The transmission signal output from the front-end circuit 5 is transmitted to a base station through the antenna 6.

The case is assumed where this transmission module 1 operates so that a power level of a transmission signal is caused to be a maximum (for example, about 24 dBm at an antenna end). For example, assume that the loss in the band pass filter circuit 3 is about 1.0 dB, that the loss in the switch 42 is about 0.5 dB, that the loss in the duplexer 50 is about 1.5 dB, and that the loss in the antenna switch 51 is about 0.8 dB. In the case where the power level is caused to be about 24 dBm at the antenna end, powers of the transmission signal at respective terminals have to be about 24.8 dBm at an input end of the antenna switch 51, about 26.3 dBm at an input end of the duplexer 50, and about 26.8 dBm at an input end of the switch 42. When the combined gain of the amplifiers 40 and 41 is about 27 dB, powers of the transmission signal at respective terminals have to be about −0.2 dBm at an input end of the amplifier 40 and about 0.8 dBm at an input end of the band pass filter circuit 3. Hence, the RF-IC 2 has to output a transmission signal of about 0.8 dBm.

Figure 2B:
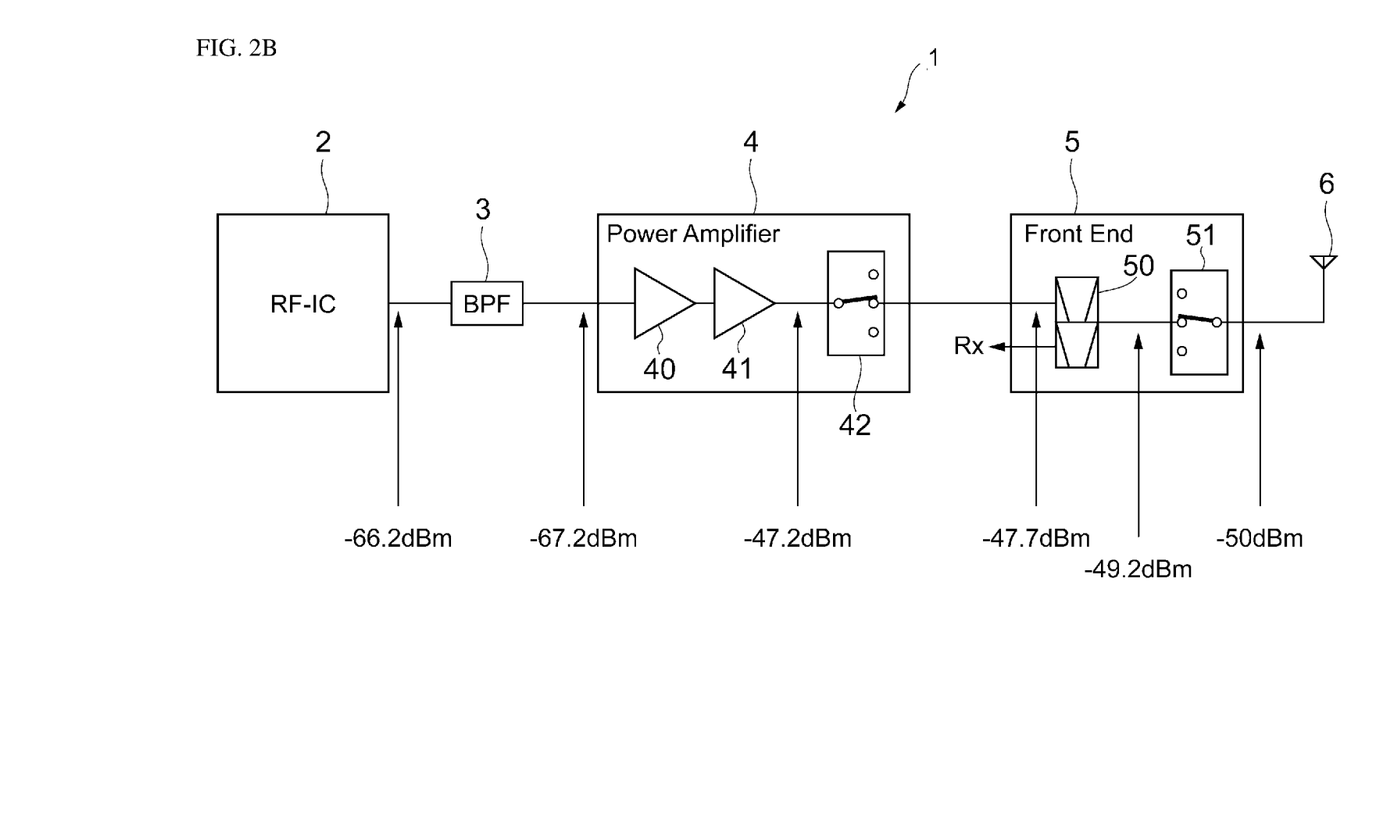
FIG. 2B illustrates, in the case where a power level of a transmission signal is caused to be a minimum, an example of a power of the transmission signal at each terminal of the transmission module.

On the other hand, FIG. 2B illustrates, in the case where a power level of a transmission signal is caused to be a minimum, an example of a power of the transmission signal at each terminal of the transmission module. The case is assumed where the transmission module 1 described with reference to FIG. 2A operates so that a power level of a transmission signal is caused to be a minimum (for example, about −50 dBm at the antenna end). In the case where the power level is caused to be about −50 dBm at the antenna end, powers of the transmission signal at the respective terminals have to be about −49.2 dBm at the input end of the antenna switch 51, about −47.7 dBm at the input end of the duplexer 50, and about −47.2 dBm at the input end of the switch 42. When the combined gain of the amplifiers 40 and 41 is reduced from about 27 dB described above to about 20 dB, powers of the transmission signal at the respective terminals have to be about −67.2 dBm at the input end of the amplifier 40 and about −66.2 dBm at the input end of the band pass filter circuit 3. Hence, the RF-IC 2 has to output a transmission signal of about −66.2 dBm.

That is, under the above-described assumption, it is seen that the RF-IC 2 has to have an output dynamic range of about 67.0 dB to achieve power levels ranging from the maximum to the minimum of a transmission signal. Thus, if a gain range of the amplifiers 40 and 41 can be increased, the output dynamic range of the RF-IC 2 can be reduced. A configuration of a power amplifier circuit that achieves such a large range of power gain will be described below.

Figure 3:
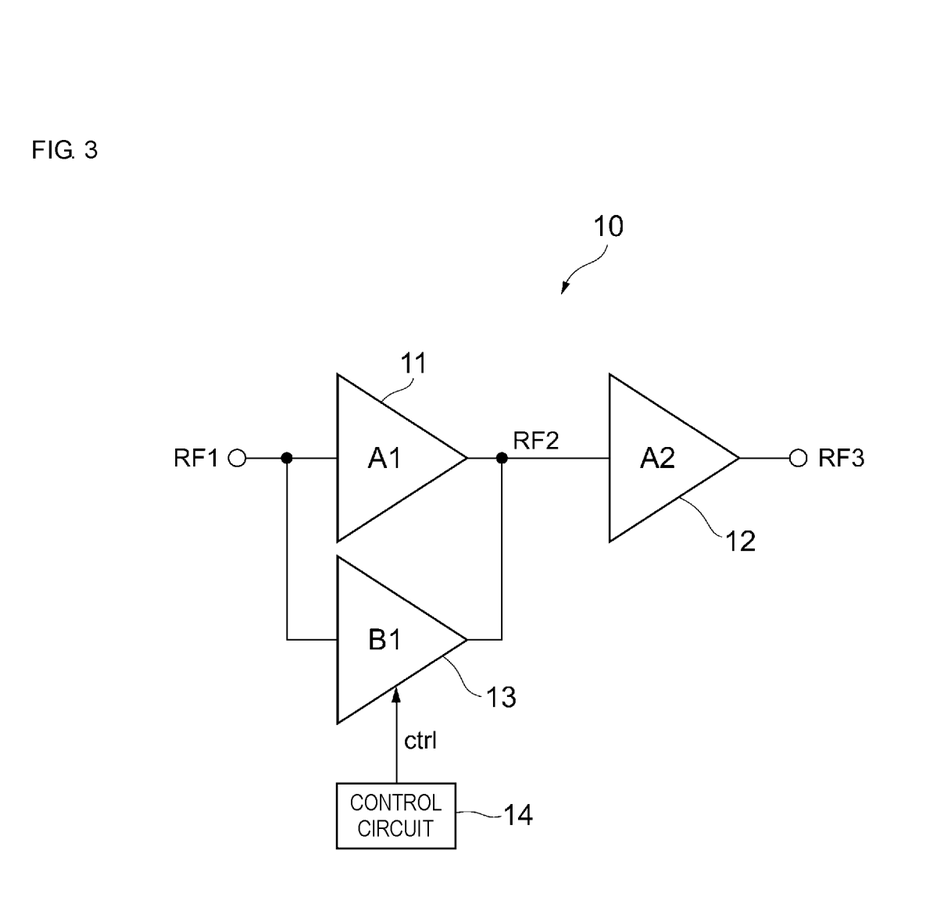
FIG. 3 is a block diagram illustrating an example of a configuration of a power amplifier circuit according to a first embodiment of the present disclosure.

FIG. 3 is a block diagram illustrating an example of a configuration of a power amplifier circuit according to a first embodiment of the present disclosure. As illustrated in FIG. 3, a power amplifier circuit 10 amplifies power in two stages by using a first-stage (drive-stage) amplifier 11 and a subsequent-stage (power-stage) amplifier 12. Specifically, the drive-stage amplifier 11 (first amplifier) amplifies a signal RF1 (input signal) and outputs a signal RF2 (output signal). The power-stage amplifier 12 amplifies the signal RF2 output from the drive-stage amplifier 11 further and outputs a signal RF3. Furthermore, an amplifier 13 (second amplifier) for adjusting the gain of the drive stage is connected in parallel with the drive-stage amplifier 11. The amplifier 13 is controlled to be on or off in accordance with a control signal ctrl supplied from a control circuit 14.

Assume that a gain of the amplifier 11 is A1, that a gain of the amplifier 12 is A2, and that a gain of the amplifier 13 is B1. Note that, for convenience of explanation, the gains A1, A2, and B1 herein are expressed not in decibels but as a ratio of input power to output power. For example, the amplifier 13 is an amplifier that intentionally reduces the gain of the drive stage by cancelling a signal of the amplifier 11 with a signal having an opposite phase. The gain of this amplifier 13 for cancellation is less than the gain of the amplifier 11 (B1<A1). Incidentally, either the gain A1 of the drive-stage amplifier 11 may be higher than the gain A2 of the power-stage amplifier 12 or the gain A2 of the power-stage amplifier 12 may be higher than the gain A1 of the drive-stage amplifier 11. Alternatively, the gain A1 of the drive-stage amplifier 11 may be equal to the gain A2 of the power-stage amplifier 12.

In this embodiment, when the power amplifier circuit 10 operates in a high power mode (first power mode), the control circuit 14 supplies, to the amplifier 13 for cancellation, a control signal ctrl to turn the amplifier 13 off. In this case, the amplifier 13 is turned off, and the combined gain of the drive stage and the power stage is therefore A1×A2.

On the other hand, when the power amplifier circuit 10 operates in a low power mode (second power mode) lower than the high power mode in output power level, the control circuit 14 supplies, to the amplifier 13 for cancellation, a control signal ctrl to turn the amplifier 13 on. Here, the power amplifier circuit 10 is configured so that an output signal of the amplifier 11 and an output signal of the amplifier 13 for cancellation have opposite phases to each other. Hence, when the output signal of the amplifier 13 is added to the output signal of the amplifier 11, part of the amplitude of the output signal of the amplifier 11 is cancelled. Thus, in the case where the amplifier 13 is on, the power gain of the drive stage decreases in comparison with the case where the amplifier 13 is off. Specifically, the combined gain of the drive stage and the power stage is $(A1-B1) \times A2$.

With respect to a method by which an output signal of the amplifier 11 and an output signal of the amplifier 13 have opposite phases, for example, the amplifiers 11 and 13 may be configured so that one of the amplifiers 11 and 13 performs inverting amplification and the other performs non-inverting amplification. Specifically, for example, an inverting amplifier may be constituted by a one-stage transistor, and a non-inverting amplifier may be constituted by two stages of transistors connected in series as a previous stage and a subsequent stage. Furthermore, an input signal may be divided into two signals so that the two signals have opposite phases to each other, and the two signals may be supplied to the respective amplifiers 11 and 13. Alternatively, signals having the same phase may be supplied to the respective amplifiers 11 and 13, and the phase of one or both of output signals of the amplifiers 11 and 13 may be converted so that the output signals have opposite phases to each other.

As described above, in the power amplifier circuit 10, an output signal of the amplifier 11 can be cancelled by an output signal of the amplifier 13, and the gain can therefore be adjusted in a wide range in comparison with a configuration in which the amplifier 13 is not included. Thus, amplification characteristics in the case where the power amplifier circuit 10 operates in the low power mode can be improved. Additionally, as described with reference to FIGS. 2A and 2B, the output dynamic range necessary for the RF-IC 2 can be reduced.

Furthermore, in comparison with three comparative examples where a gain range can be widened on the basis of another principle, the power amplifier circuit 10 achieves the following superior effects. Firstly, for example, a configuration is considered in which a power amplifier circuit includes two types of amplifiers and a switch for switching between paths of these amplifiers and performs, in accordance with a power mode in which the power amplifier circuit operates, switching to an amplifier that is to operate by using the switch. However, in such a comparative example, when the switch is inserted, power consumption may be increased when maximum power is output in particular. In this respect, in the power amplifier circuit 10 according to this embodiment, gain can be reduced without necessarily using any switch, and thus a signal can be amplified in a wide range while inhibiting an increase in power consumption in comparison with this comparative example.

Secondly, for example, a configuration is considered in which a power amplifier circuit includes one type of amplifier and directly reduces the gain of this amplifier by reducing a bias current supplied to this amplifier. However, in such a comparative example, the range of the amount of the bias current that can be adjusted is limited to a range in which the linearity of the gain of the amplifier is ensured.

Hence, in this comparative example, a sufficient gain range is not able to be obtained (for example, to such an extent that the output dynamic range necessary for an RF-IC is reduced). In this respect, in the power amplifier circuit 10 according to this embodiment, the gain of the amplifier 11 can be reduced by signal cancellation, and thus a signal can be amplified in a wide range in comparison with this comparative example.

Thirdly, for example, a configuration is considered in which a power amplifier circuit includes an attenuator in a stage preceding an amplifier and a signal is intentionally attenuated when the power amplifier circuit operates in the low power mode. However, in such a comparative example, a signal passes through the attenuator regardless of a power mode, the signal is therefore attenuated to some extent even when the power amplifier circuit operates in the high power mode, and an unintended reduction in gain may be caused. In this respect, in the power amplifier circuit 10 according to this embodiment, a signal can be kept from passing through the amplifier 13 for cancellation when the power amplifier circuit 10 operates in the high power mode, and thus a reduction in gain at a time when the power amplifier circuit 10 operates in the high power mode can be inhibited in comparison with this comparative example.

In this embodiment, the amplifier 13 for cancellation is switched between on and off in accordance with a power mode. Thus, when the amplifier 13 is turned off when the power amplifier circuit 10 operates in the high power mode, current consumption can be reduced. Note that a method of cancelling the amplitude of a signal of the amplifier 11 is not limited to this. For example, a configuration may be employed in which the gain of the amplifier 13 for cancellation is changed in accordance with a necessary output power. Specifically, for example, when the power amplifier circuit 10 operates in the high power mode, the gain of the amplifier 13 for cancellation may be controlled to be greater than or equal to zero and less than a predetermined level. When the power amplifier circuit 10 operates in the low power mode, the gain of the amplifier 13 may be controlled to be greater than or equal to the predetermined level and less than the gain of the amplifier 11. Furthermore, in the same power mode, for example, the gain of the amplifier 13 may be adjusted so that the gain of the amplifier 13 decreases as the output power of the power amplifier circuit 10 increases. Thus, when the gain of the amplifier 13 can be adjusted, the gain $(A1-B1)$ of the drive stage can be adjusted more finely.

Furthermore, in addition to the gain of the amplifier 13, the gain of the amplifier 11 may also be adjusted in accordance with a power mode or output power. For example, the gain of the amplifier 11 may be adjusted so that the gain of the amplifier 11 increases as the output power increases.

In this embodiment, although the configuration has been illustrated in which the amplifier 13 for cancellation is provided in the drive stage, the position where an amplifier for cancellation is provided is not limited to the drive stage. The amplifier for cancellation may be provided in any other stage or all stages.

Furthermore, the number of amplifier stages included in a power amplifier circuit is not limited to two and may be one or three or more.

Next, a specific circuit configuration of a power amplifier circuit that embodies the block diagram illustrated in FIG. 3 will be described.

Figure 4:
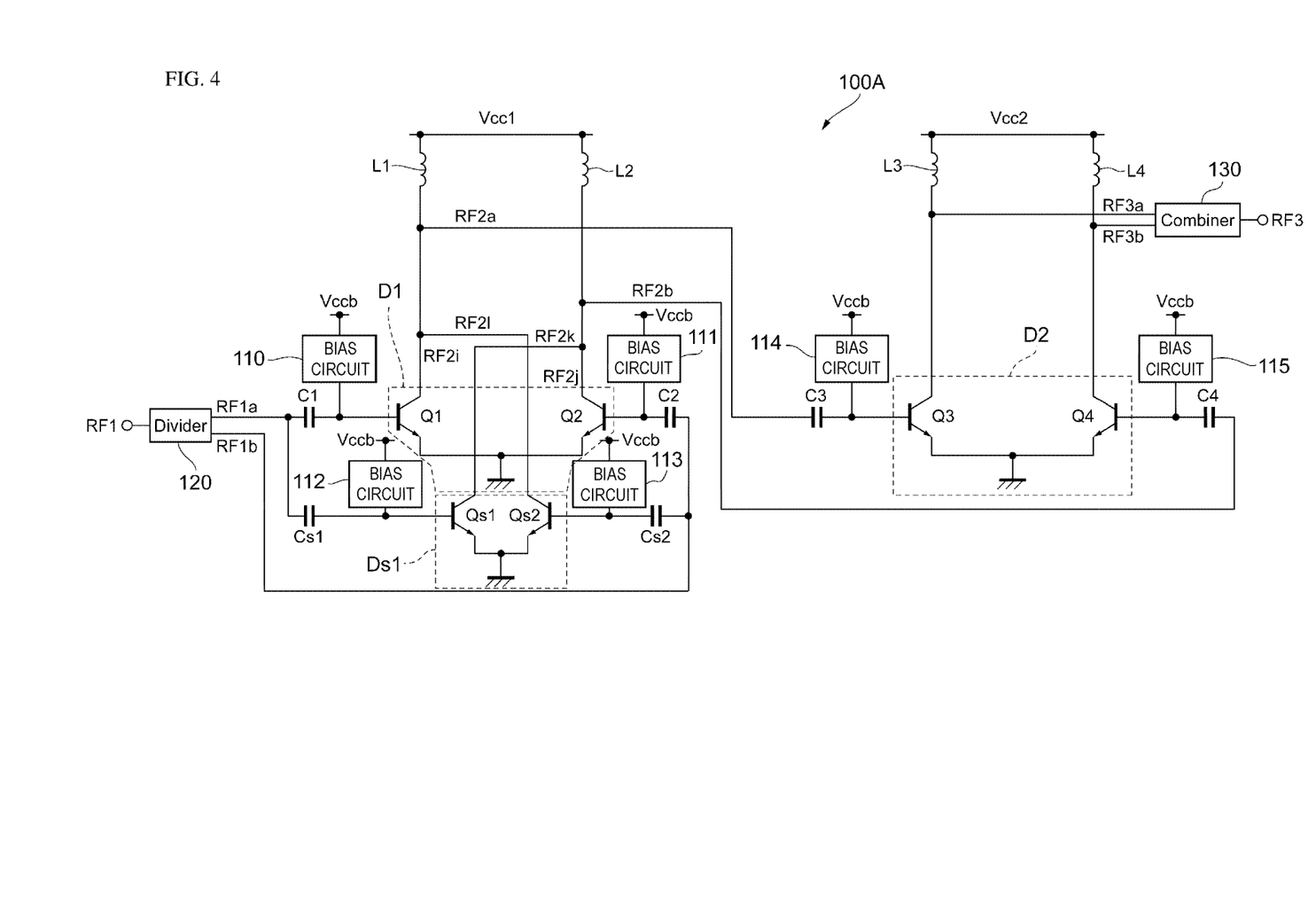
FIG. 4 is a circuit diagram illustrating an example of a configuration of a power amplifier circuit according to the first embodiment of the present disclosure.

FIG. 4 is a circuit diagram illustrating an example of a configuration of a power amplifier circuit according to the first embodiment of the present disclosure. As illustrated in FIG. 4, a power amplifier circuit 100A includes, for example, transistors Q1 to Q4, Qs1, and Qs2, bias circuits 110 to 115, a divider 120, a combiner 130, capacitors C1 to C4, Cs1, and Cs2, and inductors L1 to L4.

Each of the transistors Q1 to Q4, Qs1, and Qs2 is constituted, for example, by a bipolar transistor, such as a heterojunction bipolar transistor (HBT). Incidentally, each of the transistors Q1 to Q4, Qs1, and Qs2 is not limited to a bipolar transistor and may be constituted, for example, by a field-effect transistor, such as a metal-oxide-semiconductor field-effect transistor (MOSFET). In this case, a collector, a base, and an emitter are to be read as a drain, a gate, and a source, respectively.

The transistor Q1 (first transistor) and the transistor Q2 (second transistor) form a differential pair D1 (first differential pair) and constitute an amplifier corresponding to the drive-stage amplifier 11 illustrated in FIG. 3. The transistor Qs1 (third transistor) and the transistor Qs2 (fourth transistor) form a differential pair Ds1 (second differential pair) and constitute an amplifier corresponding to the drive-stage amplifier 13 illustrated in FIG. 3. The transistor Q3 (fifth transistor) and the transistor Q4 (sixth transistor) form a differential pair D2 (third differential pair) and constitute an amplifier corresponding to the power-stage amplifier 12 illustrated in FIG. 3. A configuration of each of the amplifiers will be described in detail later.

The bias circuits 110 to 115 generate a bias current or bias voltage and supply the bias current or bias voltage to respective bases of the transistors Q1, Q2, Qs1, Qs2, Q3, and Q4. A configuration of each of the bias circuits 110 to 115 is not limited to a particular configuration, and a detailed description thereof is omitted.

The divider 120 is provided on an input side of the drive-stage amplifiers. The divider 120 divides a signal RF1 into a signal RF1a (first signal) and a signal RF1b (second signal) that have opposite phases to each other, and outputs the signal RF1a and the signal RF1b.

The combiner 130 is provided on an output side of the power-stage amplifier. The combiner 130 combines a signal RF3a (fifth signal) and a signal RF3b (sixth signal) that have been respectively output from the transistor Q3 and the transistor Q4 and outputs a signal RF3.

Each of the capacitors C1 to C4, Cs1, and Cs2 removes a direct-current component of an RF signal. Each of the inductors L1 to L4 keeps an RF signal from being coupled to a power supply circuit (not illustrated).

Incidentally, although omitted from FIG. 4, the power amplifier circuit 100A may include, prior to and subsequent to each of the drive-stage and power-stage amplifiers, a matching network that performs impedance matching between circuits.

Next, the operation of each amplifier will be specifically described. In the transistor Q1, a power-supply voltage Vcc1 is supplied to a collector through the inductor L1, the signal RF1a is supplied to a base through the capacitor C1, and an emitter is grounded. Furthermore, a bias current or bias voltage output from the bias circuit 110 is supplied to the base of the transistor Q1. Thus, a signal RF2i (first amplified signal) obtained by amplifying the signal RF1a is output from the collector of the transistor Q1.

Similarly, in the transistor Q2, the power-supply voltage Vcc1 is supplied to a collector through the inductor L2, the signal RF1b is supplied to a base through the capacitor C2, and an emitter is grounded while being connected to the emitter of the transistor Q1. Furthermore, a bias current or bias voltage output from the bias circuit 111 is supplied to the base of the transistor Q2. Thus, a signal RF2j (second amplified signal) obtained by amplifying the signal RF1b is output from the collector of the transistor Q2. Ideally, a phase difference between the signal RF1a supplied to the base of the transistor Q1 and the signal RF1b supplied to the base of the transistor Q2 is preferably about 180 degrees.

The transistors Qs1 and Qs2 for cancellation are connected to the transistors Q1 and Q2 for amplification so that bases of the transistors Qs1 and Qs2 alternate with the bases of the transistors Q1 and Q2 and so that collectors of the transistors Qs1 and Qs2 alternate with the collectors of the transistors Q1 and Q2.

Specifically, in the transistor Qs1, the power-supply voltage Vcc1 is supplied to the collector through the inductor L2, the signal RF1a (that is, the same signal as that supplied to the base of the transistor Q1) is supplied to the base through the capacitor Cs1, and an emitter is grounded. Furthermore, the collector of the transistor Qs1 is connected to the collector of the transistor Q2. When a bias current or bias voltage is supplied from the bias circuit 112 to the base of the transistor Qs1, the transistor Qs1 is turned on, and a signal RF2k (third amplified signal) obtained by amplifying the signal RF1a is output from the collector of the transistor Qs1 (that is, the collector of transistor Q2).

Similarly, in the transistor Qs2, the power-supply voltage Vcc1 is supplied to the collector through the inductor L1, the signal RF1b (that is, the same signal as that supplied to the base of the transistor Q2) is supplied to the base through the capacitor Cs2, and an emitter is grounded while being connected to the emitter of the transistor Qs1. Furthermore, the collector of the transistor Qs2 is connected to the collector of the transistor Q1. When a bias current or bias voltage is supplied from the bias circuit 113 to the base of the transistor Qs2, the transistor Qs2 is turned on, and a signal RF2l (fourth amplified signal) obtained by amplifying the signal RF1b is output from the collector of the transistor Qs2 (that is, the collector of the transistor Q1).

The gain B1 of the transistors Qs1 and Qs2 for cancellation is less than the gain A1 of the transistors Q1 and Q2 (B1<A1). A difference between the gain of the transistors Q1 and Q2 and the gain of the transistors Qs1 and Qs2 may be adjusted by a bias current or bias voltage supplied from each of the bias circuits 110 to 113, or alternatively may be adjusted by designing the sizes of the transistors Qs1 and Qs2 so that they are smaller than the sizes of the transistors Q1 and Q2.

In this embodiment, when the power amplifier circuit 100A operates in the high power mode, the transistors Qs1 and Qs2 for cancellation are controlled to be turned off. In this case, the signals RF2i and RF2j output from the transistors Q1 and Q2 are directly output as output signals RF2a and RF2b of the drive stage.

On the other hand, when the power amplifier circuit 100A operates in the low power mode, the transistors Qs1 and Qs2 for cancellation are controlled to be turned on. In this case, when the signal RF2l having an opposite phase to a phase of the signal RF2i is added to the signal RF2i output from the collector of the transistor Q1, part of the amplitude of the signal RF2i is cancelled by the signal RF2l. Similarly, when the signal RF2k having an opposite phase to a phase of the signal RF2j is added to the signal RF2j output from the collector of the transistor Q2, part of the amplitude of the signal RF2j is cancelled by the signal RF2k. Thus, a signal (third signal) obtained by combining the signal RF2i and the signal RF2l is output as the output signal RF2a of the drive stage, a signal (fourth signal) obtained by combining the signal RF2j and the signal RF2k is output as the output signal RF2b of the drive stage, and the gain of the drive stage therefore decreases in comparison with the case where the transistors Qs1 and Qs2 are off. As a result, in the power amplifier circuit 100A, the gain of the drive stage can be reduced when the power amplifier circuit 100A operates in the low power mode.

Incidentally, control where the transistors Qs1 and Qs2 are turned on or off may be performed by a control circuit (not illustrated) supplying a control signal to the bias circuits 112 and 113 and controlling the amounts of bias currents supplied to the transistors Qs1 and Qs2 by the bias circuits 112 and 113.

The output signals RF2a and RF2b output from the drive stage are supplied to the respective bases of the transistors Q3 and Q4 of the power stage.

In the transistor Q3, a power-supply voltage Vcc2 is supplied to a collector through the inductor L3, the output signal RF2a is supplied to the base through the capacitor C3, and an emitter is grounded. Furthermore, a bias current or bias voltage is supplied from the bias circuit 114 to the base of the transistor Q3. Thus, the signal RF3a (fifth signal) is output from the collector of the transistor Q3.

In the transistor Q4, the power-supply voltage Vcc2 is supplied to a collector through the inductor L4, the output signal RF2b is supplied to the base through the capacitor C4, and an emitter is grounded. Furthermore, a bias current or bias voltage is supplied from the bias circuit 115 to the base of the transistor Q4. Thus, the signal RF3b (sixth signal) is output from the collector of the transistor Q4. These signals RF3a and RF3b are combined in the combiner 130 and output as the signal RF3.

In the above-described configuration, the power amplifier circuit 100A can achieve effects of the power amplifier circuit 10 illustrated in FIG. 3. Furthermore, when the differential pairs are used as the amplifiers 11 to 13, the number of elements, such as a matching network, necessary for the amplifier 13 is reduced, and the amplifier 13 can be easily added. In this embodiment, the example has been illustrated in which the power-stage amplifier is constituted by the differential pair D2, whereas, instead of this, the power-stage amplifier may be constituted by a one-stage transistor that does not constitute a differential pair. In this case, for example, a configuration may be employed in which the output signals RF2a and RF2b of the drive stage are combined by a combiner and converted into a single-phase signal and then the single-phase signal is supplied to the power-stage amplifier.

Furthermore, in this embodiment, although the configuration has been illustrated in which transistors forming a pair in the differential pairs D1, Ds1, and D2 include respective bias circuits, a bias circuit may be shared between transistors forming a pair. When a bias circuit is shared, variations between elements included in bias circuits can be avoided, thereby improving differential amplification performance.

Figure 5:
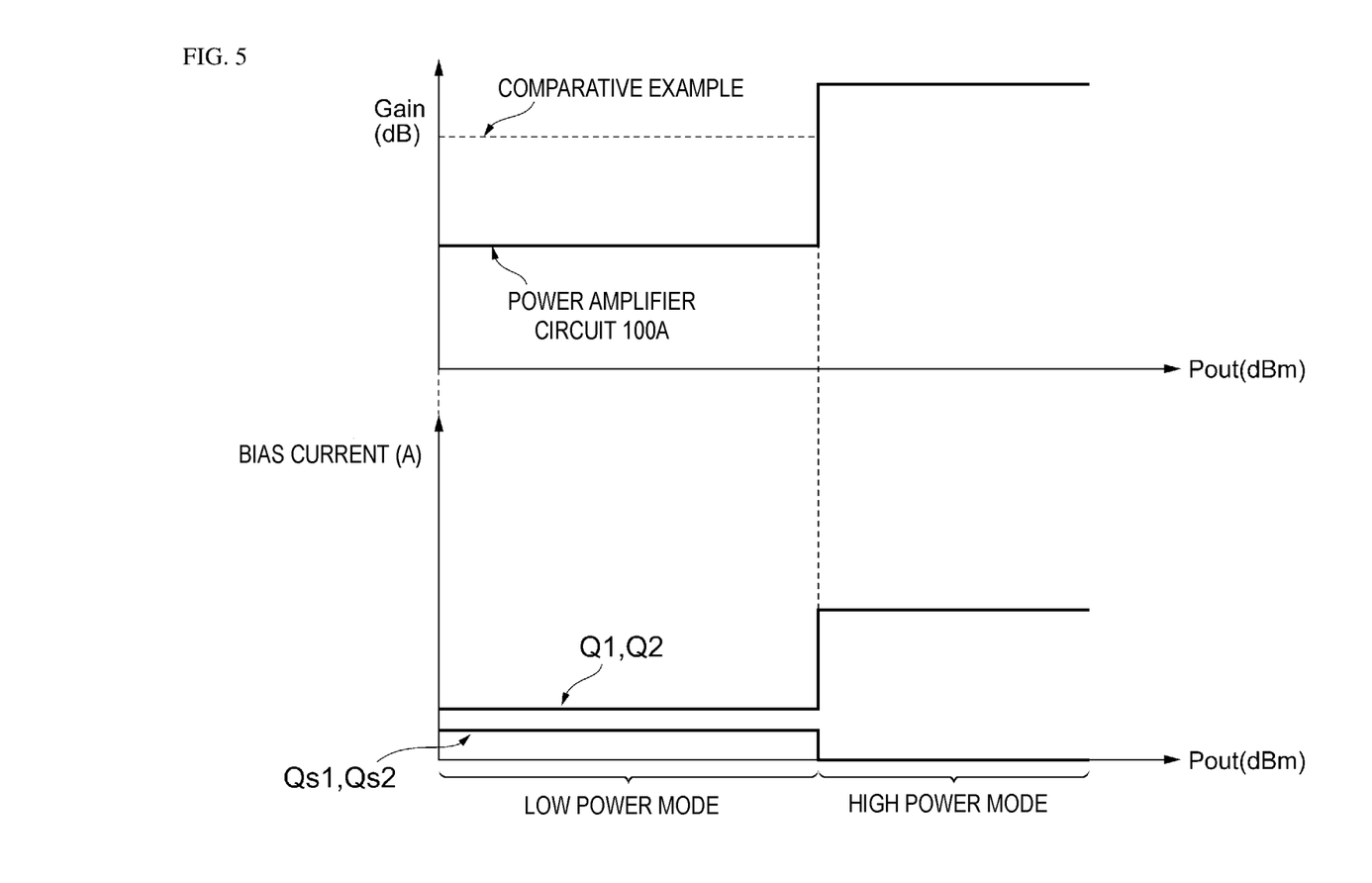
FIG. 5 is a graph illustrating, in the power amplifier circuit, an image of a relationship between output power and gain and a relationship between output power and bias current.

FIG. 5 is a graph illustrating, in the power amplifier circuit 100A, an image of a relationship between output power and gain and a relationship between output power and bias current. Specifically, FIG. 5 illustrates the gains of the power amplifier circuit 100A (solid line) and a comparative example (dashed line), and the amounts of bias currents supplied to the transistors Q1, Q2, Qs1, and Qs2 in the power amplifier circuit 100A. Here, the comparative example refers to a configuration in which, among constituent elements included in the power amplifier circuit 100A, elements involved in the amplifier for cancellation (that is, the transistors Qs1 and Qs2, the bias circuits 112 and 113, and the capacitors Cs1 and Cs2) are not included. In FIG. 5, the horizontal axis represents output power (dBm), and the vertical axis represents gain (dB) and the amount of bias current (A).

First, when the power amplifier circuit 100A operates in the high power mode, a maximum amount of bias current is supplied to the transistors Q1 and Q2, whereas no bias current is supplied to the transistors Qs1 and Qs2. At this time, the transistors Qs1 and Qs2 are turned off, and the gain of the power amplifier circuit 100A is therefore maximized. On the other hand, when the power amplifier circuit 100A operates in the low power mode, the amount of bias current supplied to the transistors Q1 and Q2 decreases, and a bias current is supplied to the transistors Qs1 and Qs2. At this time, in addition to reductions in the gains of the transistors Q1 and Q2 themselves, the transistors Qs1 and Qs2 for cancellation are turned on, and the gain can therefore be greatly reduced in comparison with the comparative example (dashed line). Thus, when the power amplifier circuit 100A includes the transistors Qs1 and Qs2 for cancellation, a gain range can be widened in comparison with the comparative example. In this embodiment, control is performed so that the amount of bias current supplied to the transistors Q1 and Q2 is larger than the amount of bias current supplied to the transistors Qs1 and Qs2 (see FIG. 5). Note that, as long as a relationship of B1<A1 holds between the gain A1 of the amplifier 11 and the gain B1 of the amplifier 13, a magnitude relationship between the amount of bias current supplied to the transistors Q1 and Q2 and the amount of bias current supplied to the transistors Qs1 and Qs2 is not limited to a particular relationship. For example, if the transistors Q1 and Q2 are constituted by FETs of relatively large size and the transistors Qs1 and Qs2 are constituted by FETs of relatively small size, the amount of bias current supplied to the transistors Q1 and Q2 may be smaller than the amount of bias current supplied to the transistors Qs1 and Qs2 in some cases.

Figure 6:
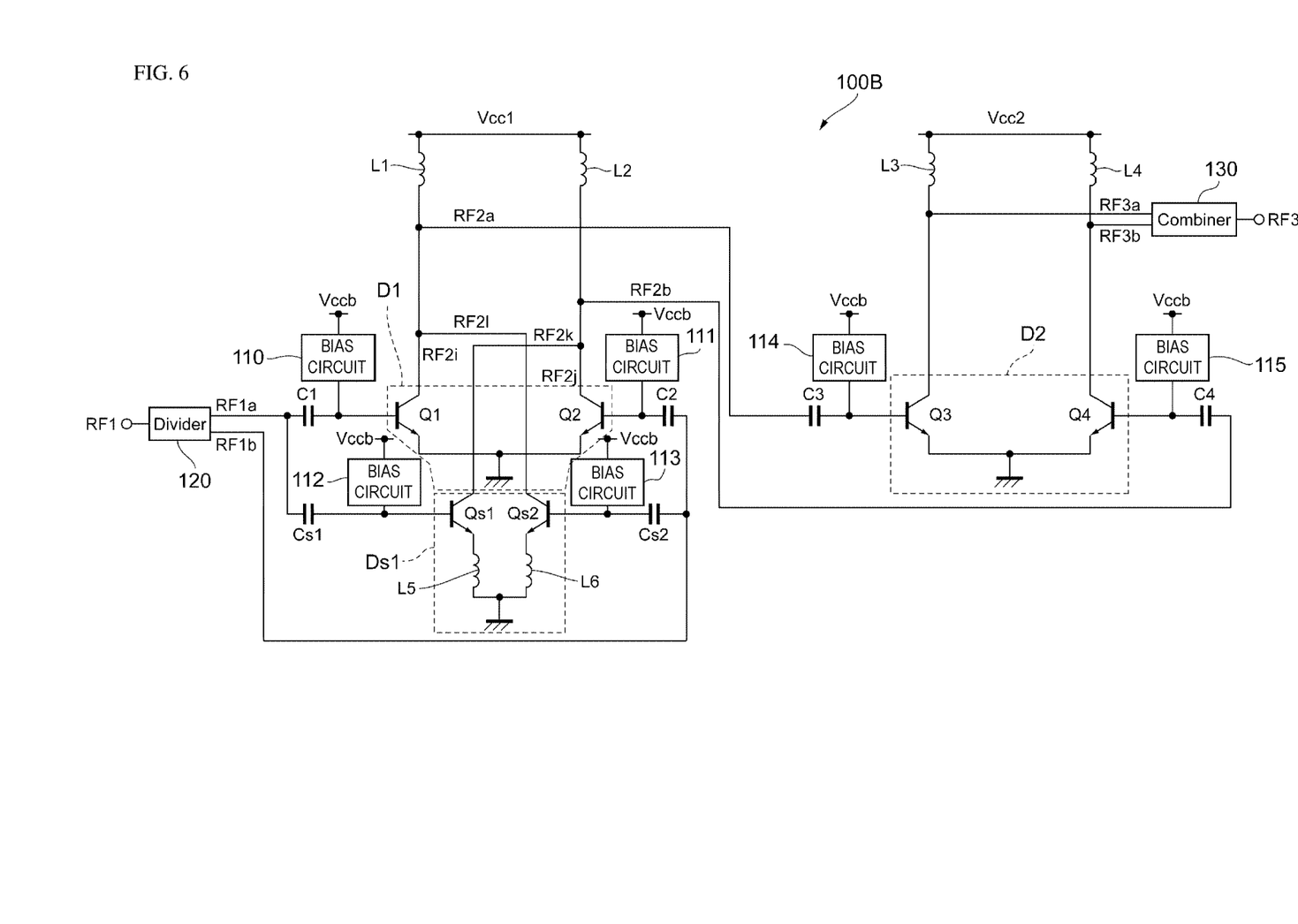
FIG. 6 is a circuit diagram illustrating an example of a configuration of a power amplifier circuit according to a second embodiment of the present disclosure.

FIG. 6 is a circuit diagram illustrating an example of a configuration of a power amplifier circuit according to a second embodiment of the present disclosure. In second and subsequent embodiments, elements that are the same as those in the first embodiment are denoted by the same reference numerals, and a description thereof is omitted. Furthermore, in the second and subsequent embodiments, a description of things in common with the first embodiment is omitted, and only respects in which the second and subsequent embodiments differ from the first embodiment will be described. In particular, similar function effects achieved by similar configurations are not repeatedly described in each embodiment.

As illustrated in FIG. 6, in comparison with the power amplifier circuit 100A, a power amplifier circuit 100B further includes inductors L5 and L6.

The inductors L5 and L6 are provided between the respective emitters of the transistors Qs1 and Qs2 for cancellation and the ground. Each of the inductors L5 and L6 is a specific example of an impedance element having a certain impedance value. When elements having a certain impedance value are provided between the emitters of the transistors Qs1 and Qs2 and the ground, the transistors Qs1 and Qs2 can be easily controlled in comparison with the power amplifier circuit 100A. This will be described with reference to FIG. 7.

Figure 7:
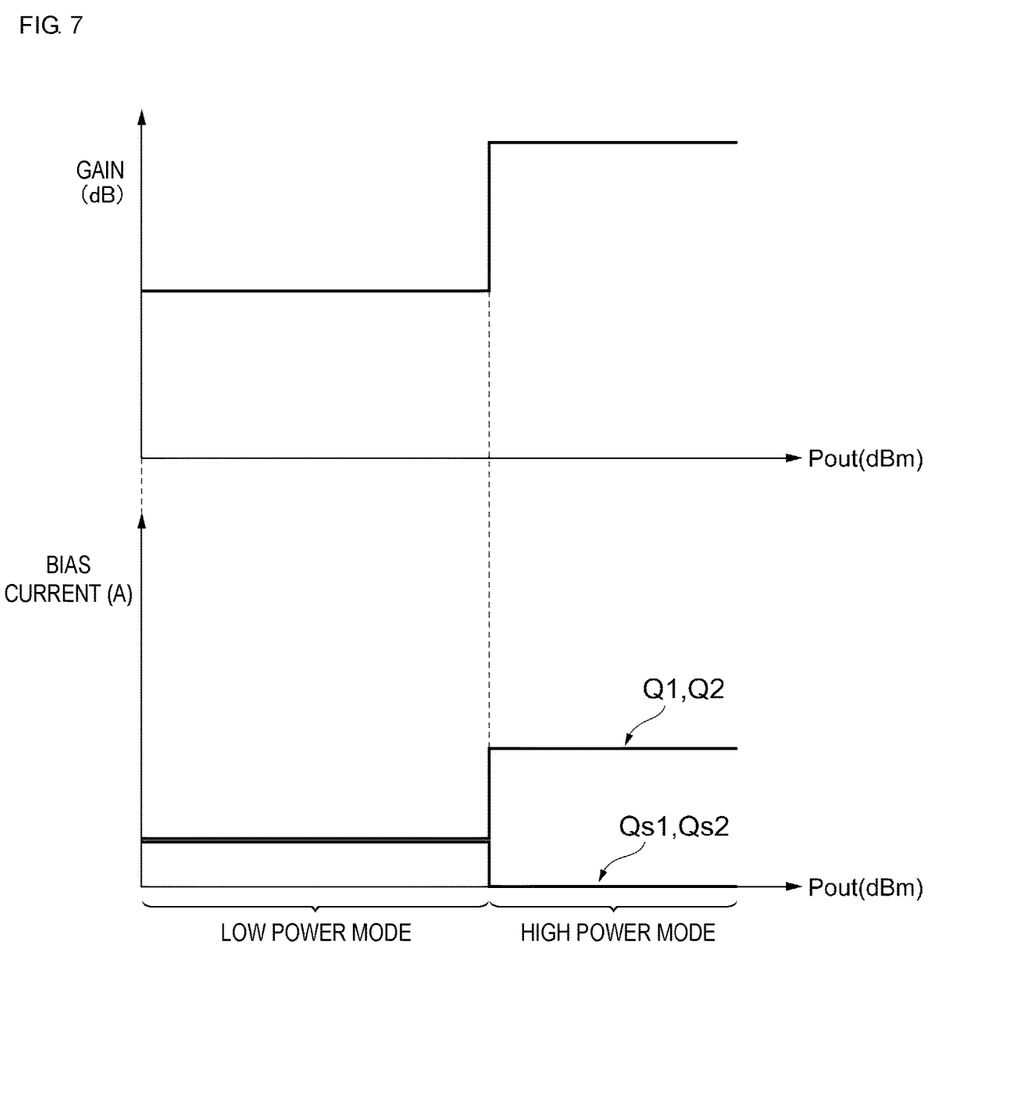
FIG. 7 is a graph illustrating, in the power amplifier circuit, an image of a relationship between output power and gain and a relationship between output power and bias current.

FIG. 7 is a graph illustrating, in the power amplifier circuit 100B, an image of a relationship between output power and gain and a relationship between output power and bias current. Specifically, FIG. 7 illustrates the gain of the power amplifier circuit 100B and the amounts of bias currents supplied to the transistors Q1, Q2, Qs1, and Qs2. In FIG. 7, the horizontal axis represents output power (dBm), and the vertical axis represents gain (dB) and the amount of bias current (A).

In the power amplifier circuit 100B, the inductors L5 and L6 are connected to the emitters of the transistors Qs1 and Qs2 for cancellation. Hence, as illustrated in FIG. 7, even when the same amount of bias current as the amount of bias current supplied to the transistors Q1 and Q2 is supplied to the transistors Qs1 and Qs2, the gain A1 of the transistors Q1 and Q2 can be kept higher than the gain B1 of the transistors Qs1 and Qs2 (B1<A1). Thus, in the power amplifier circuit 100B, even if the amount of bias current supplied to the transistors Q1 and Q2 is equal to the amount of bias current supplied to the transistors Qs1 and Qs2, when inductance values of the inductors L5 and L6 are appropriately designed, the gain (A1−B1) of the drive stage can be appropriately adjusted.

Incidentally, each of the impedance elements provided between the emitters of the transistors Qs1 and Qs2 and the ground is not limited to an inductor and may be, for example, a resistance element in place of the inductor.

Figure 8:
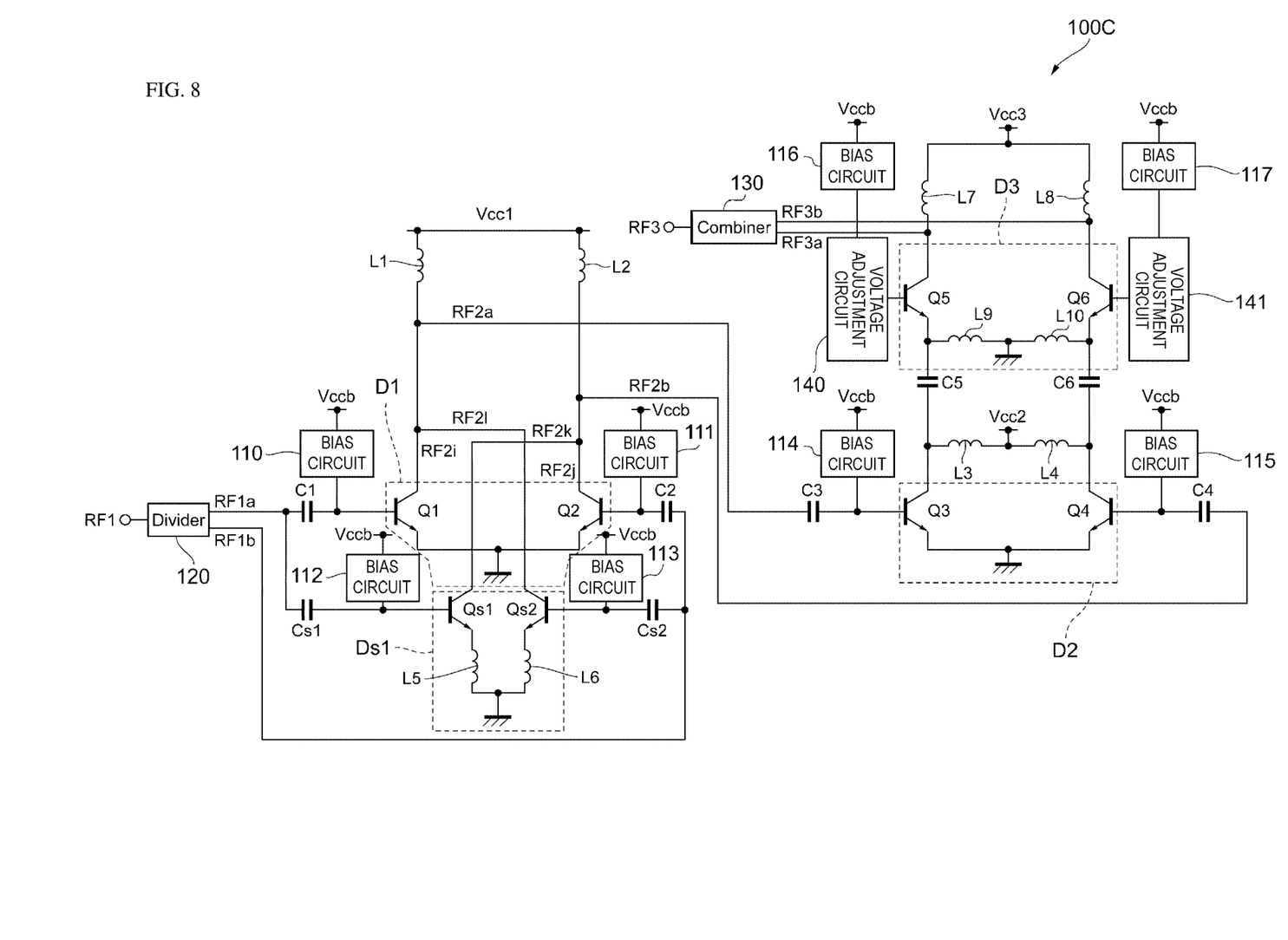
FIG. 8 is a circuit diagram illustrating an example of a configuration of a power amplifier circuit according to a third embodiment of the present disclosure.

FIG. 8 is a circuit diagram illustrating an example of a configuration of a power amplifier circuit according to a third embodiment of the present disclosure. As illustrated in FIG. 8, a power amplifier circuit 100C differs from the power amplifier circuit 100B in the configuration of the power stage.

Specifically, in comparison with the power stage of the power amplifier circuit 100B, the power stage of the power amplifier circuit 100C further includes transistors Q5 and Q6, bias circuits 116 and 117, voltage adjustment circuits 140 and 141, a pair of capacitors C5 and C6, inductors L7 and L8, and a pair of inductors L9 and L10.

In this embodiment, in an upper stage above the differential pair D2 including the transistor Q3 (fifth transistor) and the transistor Q4 (sixth transistor), a differential pair D3 (fourth differential pair) including the transistor Q5 (seventh transistor) and the transistor Q6 (eighth transistor) is connected.

Specifically, in the transistor Q5, a power-supply voltage Vcc3 is supplied to a collector through the inductor L7, a bias current or bias voltage is supplied from the bias circuit 116 to a base through the voltage adjustment circuit 140, and an emitter is grounded through the inductor L9. In the transistor Q6, the power-supply voltage Vcc3 is supplied to a collector through the inductor L8, a bias current or bias voltage is supplied from the bias circuit 117 to a base through the voltage adjustment circuit 141, and an emitter is grounded through the inductor L10. Furthermore, the emitter of the transistor Q5 is connected to the collector of the transistor Q3 through the capacitor C5. The emitter of the transistor Q6 is connected to the collector of the transistor Q4 through the capacitor C6. Thus, signals RF3a (seventh signal) and RF3b (eighth signal) obtained by amplifying signals output from the lower transistors Q3 and Q4 further are output from the respective collectors of the upper transistors Q5 and Q6.

The bias circuits 116 and 117 supply a bias current or bias voltage to the respective bases of the transistors Q5 and Q6.

The voltage adjustment circuit 140 is provided between the bias circuit 116 and the base of the upper transistor Q5. The voltage adjustment circuit 141 is provided between the bias circuit 117 and the base of the upper transistor Q6. To cause the transistors Q5 and Q6 to be turned on, base-emitter voltages of the transistors Q5 and Q6 have to be greater than or equal to a predetermined voltage. The voltage adjustment circuits 140 and 141 adjust base input impedances of the transistors Q5 and Q6 and thereby inhibit the bias circuits 116 and 117 from restricting motions of amplitudes of voltages supplied to the bases of the transistors Q5 and Q6. Thus, the base-emitter voltages of the transistors Q5 and Q6 are kept greater than or equal to the predetermined voltage, and an operation where the transistors Q3 and Q4 are turned on or off is therefore followed by an operation where the transistors Q5 and Q6 are turned on or off. A configuration of each of the voltage adjustment circuits 140 and 141 is not limited to a particular configuration. As an example, the voltage adjustment circuit 140 may include an inductor that provides a connection between the bias circuit 116 and the base of the transistor Q5, and a capacitor that provides a connection between the base of the transistor Q5 and the ground.

The capacitors C5 and C6 have functions of isolating the respective upper transistors Q5 and Q6 from the respective lower transistors Q3 and Q4 for direct current (DC) and connecting the respective upper transistors Q5 and Q6 to the respective lower transistors Q3 and Q4 for alternating current (AC). On the other hand, the inductors L9 and L10 have functions of grounding the respective emitters of the upper transistors Q5 and Q6 for DC and connecting the respective emitters of the upper transistors Q5 and Q6 to the respective collectors of the lower transistors Q3 and Q4 for AC.

The operation of the power-stage amplifier will be described. Note that, for convenience of explanation, a description will be given assuming that both of the power-supply voltages Vcc2 and Vcc3 are, for example, a direct-current (DC) voltage of about 3 V (hereinafter referred to as DC3V).

First, in the lower differential pair D2, the power-supply voltage Vcc2 (DC3V) is supplied to the collectors of the transistors Q3 and Q4, and the amplitudes of RF signals at the collectors are therefore an alternating-current (AC) voltage of about ±3 V (hereinafter referred to as ±AC3V). Hence, the collector voltages of the transistors Q3 and Q4 are about DC3V±AC3V.

Next, in the upper differential pair D3, the emitters of the transistors Q5 and Q6 are grounded for DC and are therefore at DC0V. The emitters of the transistors Q5 and Q6 are connected to the collectors of the transistors Q3 and Q4 for AC and are therefore at about ±AC3V. Hence, the emitter voltages of the transistors Q5 and Q6 are about DC0V±AC3V. Furthermore, the power-supply voltage Vcc3 (DC3V) is supplied to the collectors of the transistors Q5 and Q6 for DC, and the amplitudes of RF signals are therefore about ±AC6V when combined with variations in emitter voltages of the transistors Q5 and Q6. Hence, the collector voltages of the upper transistors Q5 and Q6 are about DC3V±AC6V (range from about −3 V to about 9 V).

Furthermore, the lower transistors Q3 and Q4 and the upper transistors Q5 and Q6 constitute the respective differential pairs D2 and D3. Hence, when the signals RF3a and RF3b output from the differential pair D3 are combined in the combiner 130, the combined signal RF3 varies in a range of about −6 V to about 18 V. Thus, in this embodiment, when two differential pairs are connected vertically in the power stage, load impedance of the amplifier can be approximately doubled in comparison with a configuration in which no two differential pairs are connected vertically (for example, the power stage of the power amplifier circuit 100A). Hence, for example, signal amplitude is widened without necessarily increasing a power-supply voltage, and maximum output power of a signal can be increased.

As described above, the power amplifier circuit 100C enables an increase in maximum output power of a signal in addition to achieving effects similar to those of the power amplifier circuit 100B.

Incidentally, the number of differential pairs connected vertically is not limited to two and may be three or more.

Figure 9:
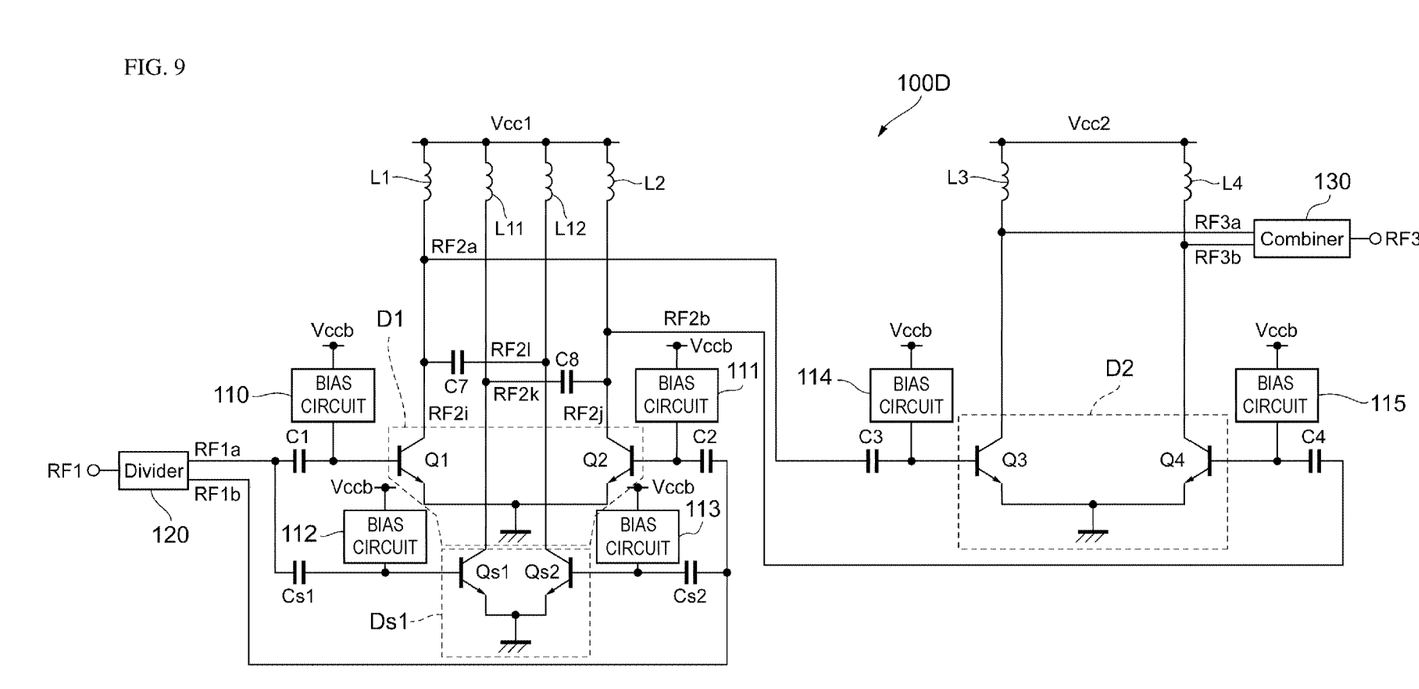
FIG. 9 is a circuit diagram illustrating an example of a configuration of a power amplifier circuit according to a fourth embodiment of the present disclosure.

FIG. 9 is a circuit diagram illustrating an example of a configuration of a power amplifier circuit according to a fourth embodiment of the present disclosure. As illustrated in FIG. 9, in comparison with the power amplifier circuit 100A, a power amplifier circuit 100D further includes inductors L11 and L12, and capacitors C7 and C8.

The inductors L11 and L12 are provided between the respective collectors of the transistors Qs1 and Qs2 and the power supply circuit (not illustrated) and keep an RF signal from being coupled to the power supply circuit (not illustrated).

The capacitor C7 connects the collector of the transistor Q1 to the collector of the transistor Qs2. The capacitor C7 is provided to block a DC voltage supplied to the transistors Q1 and Qs2 while passing the signal RF2i output from the transistor Q1 and the signal RF2l output from the transistor Qs2. The capacitor C8 connects the collector of the transistor Q2 to the collector of the transistor Qs1. The capacitor C8 is provided to block a DC voltage supplied to the transistors Q2 and Qs1 while passing the signal RF2j output from the transistor Q2 and the signal RF2k output from the transistor Qs1.

In such a configuration as well, the power amplifier circuit 100D can achieve effects similar to those of the power amplifier circuit 100A.

Incidentally, constituent elements included in the above-described embodiments may be combined. For example, the configuration of the power stage of the power amplifier circuit 100C may be used for the power stages of the power amplifier circuits 100A, 100B, and 100D. Alternatively, the inductors L5 and L6 in the power amplifier circuit 100B may be used in the configuration of the power amplifier circuit 100D.

Exemplary embodiments of the present disclosure have been described above. The power amplifier circuit 10 includes the amplifier 11 configured to amplify an input signal and output an output signal; the amplifier 13 configured to, in accordance with a control signal ctrl, amplify a signal corresponding to the input signal, generate a signal having an opposite phase to a phase of the output signal, and add the signal to the output signal; and the control circuit 14 configured to supply the control signal ctrl to the amplifier 13. The control circuit 14 outputs the control signal ctrl so that, when the power amplifier circuit 10 operates in a first power mode, a gain of the amplifier 13 is greater than or equal to zero and less than a predetermined level and so that, when the power amplifier circuit 10 operates in a second power mode lower than the first power mode in output power level, a gain of the amplifier 13 is greater than or equal to the predetermined level and less than a gain of the amplifier 11. Thus, an output signal of the amplifier 11 can be cancelled by an output signal of the amplifier 13, and gain can therefore be adjusted in a wide range in comparison with a configuration in which the amplifier 13 is not included.

Furthermore, the control circuit 14 may output the control signal ctrl so that, when the power amplifier circuit 10 operates in the first power mode, the amplifier 13 is turned off and so that, when the power amplifier circuit 10 operates in the second power mode, the amplifier 13 is turned on. Thus, current consumption at a time when the power amplifier circuit 10 operates in the high power mode can be reduced.

Furthermore, the power amplifier circuits 100A to 100D include the differential pair D1 and the differential pair Ds1. The differential pair D1 includes the transistor Q1 and the transistor Q2 that are configured to respectively amplify a signal RF1a and a signal RF1b that have opposite phases to each other and output a signal RF2i and a signal RF2j. The differential pair Ds1 includes the transistor Qs1 and the transistor Qs2 that are configured to, in accordance with the control signal ctrl, respectively amplify the signal RF1a and the signal RF1b and output a signal RF2k and a signal RF2l. A collector or drain of the transistor Qs1 is connected to a collector or drain of the transistor Q2, and a collector or drain of the transistor Qs2 is connected to a collector or drain of the transistor Q1. Thus, when the signals RF2l and RF2k having opposite phases to phases of the signals RF2i and RF2j are added to the respective signals RF2i and RF2j output from the collectors of the transistors Q1 and Q2, parts of the amplitudes of the signals RF2i and RF2j are cancelled. Hence, gain of the drive stage can be reduced when each of the power amplifier circuits 100A to 100D operates in the low power mode. Furthermore, the amplifiers 11 and 13 are constituted by differential pairs, the number of newly necessary elements, such as a matching network, is therefore reduced, and the amplifier 13 can be easily added.

Furthermore, in the power amplifier circuit 100B, the differential pair Ds1 further includes an impedance element provided between an emitter or source of the transistor Qs1 and a ground, and an impedance element provided between an emitter or source of the transistor Qs2 and the ground. Thus, even if the amount of bias current supplied to the transistors Q1 and Q2 is equal to the amount of bias current supplied to the transistors Qs1 and Qs2, when inductance values of the inductors L5 and L6 are appropriately designed, the combined gain of the differential pair D1 and the differential pair Ds1 can be appropriately adjusted.

Furthermore, the power amplifier circuits 100A-100D further include the differential pair D2 provided in a stage subsequent to the differential pair D1. The differential pair D2 includes the transistor Q3 and the transistor Q4 that are configured to respectively amplify an output signal RF2a obtained by combining the signal RF2i and the signal RF2l and an output signal RF2b obtained by combining the signal RF2j and the signal RF2k and output a signal RF3a and a signal RF3b. Thus, the power amplifier circuits 100A, 100B, and 100D can amplify power in two stages.

Furthermore, the power amplifier circuit 100C further includes the differential pair D3 provided in an upper stage above the differential pair D2; a pair of the inductors L9 and L10; and a pair of the capacitors C5 and C6. The differential pair D3 includes the transistor Q5 whose emitter or source is grounded through one of the pair of the inductors L9 and L10 and is connected to a collector or drain of the transistor Q3 through one of the pair of the capacitors C5 and C6, and the transistor Q6 whose emitter or source is grounded through another of the pair of the inductors L9 and L10 and is connected to a collector or drain of the transistor Q4 through another of the pair of the capacitors C5 and C6. The transistor Q5 outputs a signal obtained by amplifying an output signal of the transistor Q3, and the transistor Q6 outputs a signal obtained by amplifying an output signal of the transistor Q4. Thus, in comparison with a configuration in which no differential pairs are connected vertically, approximately twofold signal amplitude can be achieved.

The above-described embodiments are intended to facilitate understanding of the present disclosure, but are not intended for a limited interpretation of the present disclosure. The present disclosure can be changed or improved without departing from the gist thereof and includes equivalents thereof. That is, appropriate design changes made to the embodiments by those skilled in the art are also included in the scope of the present disclosure as long as the changes have features of the present disclosure. For example, the elements included in the embodiments, and the arrangements, materials, conditions, shapes, sizes, and so forth of the elements are not limited to those exemplified in the embodiments and can be appropriately changed. Furthermore, the elements included in the embodiments can be combined as much as technically possible, and such combined elements are also included in the scope of the present disclosure as long as the combined elements have the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
  a first amplifier configured to amplify an input signal and output an output signal;
  a second amplifier configured to, in accordance with a control signal, amplify a signal corresponding to the input signal, generate a signal having an opposite phase to a phase of the output signal, and add the signal to the output signal; and
  a control circuit configured to supply the control signal to the second amplifier so that:
    when the power amplifier circuit operates in a first power mode, a gain of the second amplifier is greater than or equal to zero and less than a predetermined level and
    when the power amplifier circuit operates in a second power mode, a gain of the second amplifier is greater than or equal to the predetermined level and less than a gain of the first amplifier, the second power mode being a lower power mode than the first power mode.

2. The power amplifier circuit according to claim 1, wherein when the power amplifier circuit operates in the first power mode, the second amplifier is turned off by the control signal, and when the power amplifier circuit operates in the second power mode, the second amplifier is turned on by the control signal.

3. The power amplifier circuit according to claim 1,
  wherein the first amplifier comprises a first differential pair,
  wherein the second amplifier comprises a second differential pair,
  wherein the first differential pair comprises a first transistor configured to amplify a first signal and output a first amplified signal, and a second transistor that is configured to amplify a second signal and output a second amplified signal, the first signal and the second signal having opposite phases,
  wherein the second differential pair comprises a third transistor configured to, in accordance with the control signal, amplify the first signal and output a third amplified signal, and a fourth transistor configured to, in accordance with the control signal, amplify the second signal and output a fourth amplified signal,
  wherein a collector or drain of the third transistor is connected to a collector or drain of the second transistor, and
  wherein a collector or drain of the fourth transistor is connected to a collector or drain of the first transistor.

4. The power amplifier circuit according to claim 2,
  wherein the first amplifier comprises a first differential pair,
  wherein the second amplifier comprises a second differential pair,
  wherein the first differential pair comprises a first transistor configured to amplify a first signal and output a first amplified signal, and a second transistor configured to amplify a second signal and output a second amplified signal, the first signal and the second signal having opposite phases,
  wherein the second differential pair comprises a third transistor configured to, in accordance with the control signal, amplify the first signal and output a third amplified signal, and a fourth transistor configured to, in accordance with the control signal, amplify the second signal and output a fourth amplified signal,
  wherein a collector or drain of the third transistor is connected to a collector or drain of the second transistor, and
  wherein a collector or drain of the fourth transistor is connected to a collector or drain of the first transistor.

5. The power amplifier circuit according to claim 3, wherein the second differential pair further comprises a first impedance element between an emitter or source of the third transistor and ground, and a second impedance element between an emitter or source of the fourth transistor and ground.

6. The power amplifier circuit according to claim 3, further comprising:
  a third differential pair in a stage subsequent to the first differential pair,
  wherein the third differential pair comprises a fifth transistor configured to amplify a third signal and output a fifth signal, and a sixth transistor configured to amplify a fourth signal and output a sixth signal, and
  wherein the third signal is a combination of the first amplified signal and the fourth amplified signal, and the fourth signal is a combination of the second amplified signal and the third amplified signal.

7. The power amplifier circuit according to claim 5, further comprising:
  a third differential pair in a stage subsequent to the first differential pair,
  wherein the third differential pair comprises a fifth transistor configured to amplify a third signal and output a fifth signal, and a sixth transistor configured to amplify a fourth signal and output a sixth signal, and
  wherein the third signal is a combination of the first amplified signal and the fourth amplified signal, and the fourth signal is a combination of the second amplified signal and the third amplified signal.

8. The power amplifier circuit according to claim 6, further comprising:
  a fourth differential pair provided in an upper stage above the third differential pair;
  a pair of inductors; and
  a pair of capacitors,
  wherein the fourth differential pair comprises:
    a seventh transistor having an emitter or source that is grounded through a first inductor of the pair of inductors and that is connected to a collector or drain of the fifth transistor through a first capacitor of the pair of capacitors, and an eighth transistor having an emitter or source that is grounded through a second inductor of the pair of inductors and that is connected to a collector or drain of the sixth transistor through a second capacitor of the pair of capacitors, wherein the seventh transistor is configured to output a seventh signal obtained by amplifying the fifth signal, and wherein the eighth transistor is configured to output an eighth signal obtained by amplifying the sixth signal.

9. The power amplifier circuit according to claim 3, wherein the first transistor, the second transistor, the third transistor, and the fourth transistor are heterojunction bipolar transistors.

10. The power amplifier circuit according to claim 4, wherein the first transistor, the second transistor, the third transistor, and the fourth transistor are heterojunction bipolar transistors.

11. The power amplifier circuit according to claim 5, wherein the first transistor, the second transistor, the third transistor, and the fourth transistor are heterojunction bipolar transistors.

12. The power amplifier circuit according to claim 6, wherein the first transistor, the second transistor, the third transistor, the fourth transistor, the fifth transistor, and the sixth transistor are heterojunction bipolar transistors.

13. The power amplifier circuit according to claim 7, wherein the first transistor, the second transistor, the third transistor, the fourth transistor, the fifth transistor, and the sixth transistor are heterojunction bipolar transistors.

14. The power amplifier circuit according to claim 8, wherein the first transistor, the second transistor, the third transistor, the fourth transistor, the fifth transistor, the sixth transistor, the seventh transistor, and the eighth transistor are heterojunction bipolar transistors.

* * * * *